(12) United States Patent
Moser et al.

(10) Patent No.: US 8,220,345 B2
(45) Date of Patent: Jul. 17, 2012

(54) GAP INSPECTION APPARATUS

(75) Inventors: Roland Moser, Zürich (CH); Niklaus Hugi, Baden (CH); Bernhard Mark, Waldshut (DE); Philipp Isler, Staufen (CH); Simon Honold, Basel (CH); Josef Erni, Winterthur (CH)

(73) Assignee: ALSTOM Technology Ltd., Baden (CH)

( * ) Notice: Subject to any disclaimer, the term of this patent is extended or adjusted under 35 U.S.C. 154(b) by 393 days.

(21) Appl. No.: 12/422,341

(22) Filed: Apr. 13, 2009

(65) Prior Publication Data

US 2009/0256584 A1    Oct. 15, 2009

(30) Foreign Application Priority Data

Apr. 14, 2008    (EP) ..................... 08154462

(51) Int. Cl.
*G01D 21/00*    (2006.01)
(52) U.S. Cl. ....................................... 73/866.5
(58) Field of Classification Search ................ 73/866.5
See application file for complete search history.

(56) References Cited

U.S. PATENT DOCUMENTS

| | | | |
|---|---|---|---|
| 4,938,083 A * | 7/1990 | Gurny et al. | 73/866.5 |
| 5,295,388 A * | 3/1994 | Fischer et al. | 73/12.09 |
| 2007/0223643 A1 | 9/2007 | Yamane et al. | |
| 2007/0277630 A1* | 12/2007 | Bagley et al. | 73/865.9 |

FOREIGN PATENT DOCUMENTS

| | | |
|---|---|---|
| DE | 8219963.9 | 11/1982 |
| EP | 0684483 | 11/1995 |
| EP | 1233278 | 8/2002 |
| EP | 1420260 | 5/2004 |
| EP | 1863153 | 12/2007 |
| EP | 2110678 | 10/2009 |

OTHER PUBLICATIONS

Search Report for German Patent App. No. 102009023194.3 (Jan. 14, 2010).
Search Report for European Patent App. No. 08154462.9 (Nov. 24, 2008).

* cited by examiner

*Primary Examiner* — Hezron E Williams
*Assistant Examiner* — Gregory J Redmann
(74) *Attorney, Agent, or Firm* — Cermak Nakajima LLP; Adam J. Cermak

(57) ABSTRACT

An apparatus for inspection of a gap between two surfaces, at least one of which is ferromagnetic, for example in a generator, includes a sensor platform (26) for one or more sensors (26a) and an elongated mount (23), which can be moved out, for the sensor platform (26). The mount (23) can be moved in and out of the gap through an access opening, can be moved out over the length of the gap and can be rolled up outside the gap by a drive (24). In its moved-out state, the mount (23) has a curvature in a lateral cross section. In addition, the mount (23) has a plurality of magnets (27) by which the mount (23) is brought into contact with a ferromagnetic surface. The magnets (27) are attached to the side of the mount (23) facing away from the ferromagnetic surface, ensuring that the mount (23) slides along a ferromagnetic surface. The apparatus allows inspection of gaps from a height of 4 mm and is distinguished by a simple and physically small design.

23 Claims, 10 Drawing Sheets

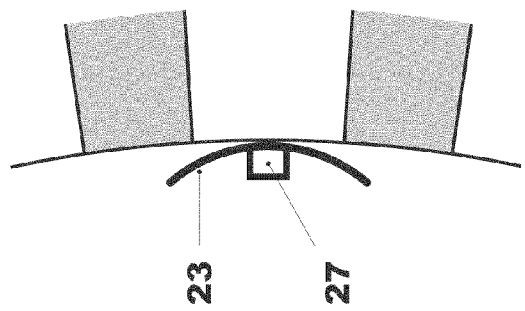
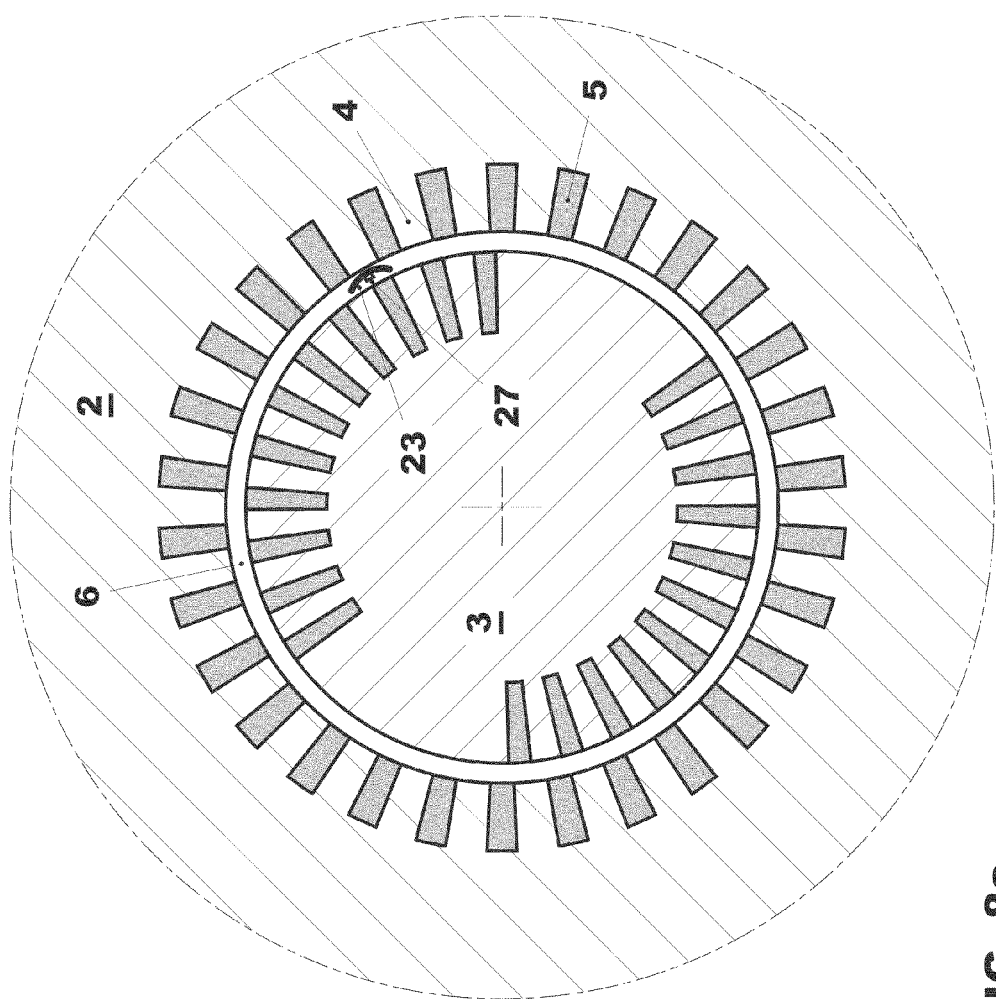
FIG. 8b
FIG. 8a

GAP INSPECTION APPARATUS

This application claims priority under 35 U.S.C. §119 to European application number 08 154 462.9, filed 14 Apr. 2008, the entirety of which is incorporated by reference herein.

BACKGROUND

1. Field of Endeavor

The invention relates to an apparatus for inspection of a narrow air gap between two surfaces with a probe, wherein at least one of the two surfaces is ferromagnetic. The invention relates in particular to an apparatus having a motor for movement of the probe, wherein the motor is arranged outside the gap and the probe can be moved into the gap through a single access.

2. Brief Description of the Related Art

Machines, motors and industrial apparatuses with a long operating life are typically inspected for their serviceability at regular time intervals. For example, turbines, boilers or generators are inspected for damage on the surfaces of the components, in order to prevent failure or damage during operation, in that any damage must be rectified or components must be replaced. In order to carry out an inspection with as little effort as possible and in a short time, the machine should, if possible, not be disassembled. However, only a limited amount of space and narrow accesses are frequently available for inspection. For example, the stator and rotor of the generator are inspected via a narrow air gap between the surfaces of the stator and rotor.

Various inspection apparatuses are known, as follows, for inspections of this type.

By way of example, U.S. Pat. No. 6,672,413 discloses a remotely controlled apparatus for inspection of spaces which are not accessible by people. This includes one or more carriages which are connected to one another by a hinge. The carriages have a motor as well as magnets which ensure contact with the surfaces, in particular with surfaces from which the apparatus would otherwise slide off because of the force of gravity. Because of its size and complexity, the apparatus is suitable only for spaces above a specific size.

EP 684483 discloses a system for inspection of a generator whose rotor need not be removed for inspection. It includes one or more sensors on a carriage with wheels which roll at the same time along the surfaces of the rotor and in slots in the stator. The apparatus is moved by a motor outside the machine to be inspected and a cable which extends over the length of the machine to its two ends. While the system allows inspection of a narrow gap with a size of more than 40 mm, access is required from both sides of the machine for its installation.

EP 1420260 discloses a detector for inspection of a generator stator with a built-in rotor having a rail which is mounted at one end of the stator and is magnetically attached in stator slots. After installation of the rail, the carriage can be moved along the rail by a remotely controlled drive, a cable which can be pulled on, preferably with a direction-changing roller, and a spring.

EP 1233278 discloses an apparatus for inspection of the air gap between the stator and the rotor of a generator with a built-in rotor, for whose attachment access is required from both sides of the air gap.

U.S. Pat. No. 6,100,711 discloses an apparatus for inspection of an air gap in a generator. The apparatus includes a telescopic mast which is brought into contact with its side walls by side elements for positioning in the air gap. A motor for onward movement of the apparatus is mounted on this. The apparatus requires a minimum air gap height of half an inch.

EP 1 863 153 discloses an inspection apparatus for an air gap which includes a mast in the form of an expandable tube which can be folded up and on which a sensor head is mounted. For this purpose, the mast includes two parts which are separated from one another along their length and thus widen the mast. The mast is composed of material which can be rolled up and can be rolled out and rolled up by a drive outside the air gap. The mast is inserted, in a folded-up state, into the air gap from one end of the gap. Once it has been inserted, its width is widened, as a result of which it achieves the required stiffness to move the sensor onward. The sensor and mast are then guided by the drive along the length of the gap. When the sensor is not in use, the mast is stored, rolled up, in its folded-up state.

SUMMARY

One of numerous aspects of the present invention includes providing an apparatus for automatic inspection of narrow air gaps between surfaces, wherein at least one surface is ferromagnetic, for example in machines, in particular generators. The aim of the apparatus is to allow inspection of narrow air gaps without having to enlarge the air gaps by removal of components. It should also be possible to install the apparatus, and to move it within the air gap, easily and efficiently.

An exemplary apparatus for inspection of an air gap between surfaces, of which at least one of the two surfaces is ferromagnetic, has a sensor platform with one or more sensors which are attached to an elongated mount which can be moved out, wherein the mount can be moved backward and forward into and out of the gap through a single access opening, can be moved forward and backward over the length of the gap, and can be rolled up outside the gap by a drive. According to another aspect of the invention, the mount has a plurality of magnets which are distributed over the length of the mount and bring the mount into contact with a ferromagnetic surface, and hold it. The magnets are in this case attached to a surface of the mount facing away from the ferromagnetic surface. The magnets result in a continuous contact along the entire length of the extended mount with the surface to be inspected and allow the sensor platform to be moved forwards without the mount bending. The arrangement of the magnets on the side of the mount facing away from the ferromagnetic surface ensures that the mount slides uniformly along the surface, and therefore ensures unimpeded extension and retraction.

In one embodiment of the invention, at least in the moved-out state, the mount additionally has a curvature in a cross section at right angles to its longitudinal extent.

The curvature in the cross section ensures that, in its moved-out state, the mount has a stiffness which allows the mount to be introduced into a gap without hanging down or bending. Furthermore, the magnets on the mount ensure that the mount remains in contact with the ferromagnetic surface during the movement along the gap and during the inspection measurements in the gap. Together with the curvature of the mount, this on the one hand makes it possible for the mount to be inserted in a controlled manner into the gap as far as its end, and to be withdrawn again, without bending, curving or moving away from the ferromagnetic surface. The contact with the surface also ensures that the same distance is maintained between the sensor measurement head and the ferromagnetic surface in every position along the gap.

The magnets are attached to a surface of the mount which faces away from the ferromagnetic surface with which the mount is in contact. They are therefore not in direct contact with the ferromagnetic surface but act through the mount from the opposite side. The attachment of the magnets to the side of the mount facing away from the ferromagnetic surface allows correct sliding along the surface without any possibility of the magnets bumping into irregularities on the surface. Furthermore, this placing avoids the mount from being held excessively strongly on the surface by the magnetic forces, which would impede sliding.

The magnets furthermore guarantee that the mount with the sensor remains in contact with ferromagnetic surfaces even when the force of gravity on the mount is acting against the holding force of the magnets.

The mount can be rolled up, which allows storage in a small area and therefore also versatile placing of the apparatus at points in machines where the spatial conditions are confined. Furthermore, the efficient use of space for storage simplifies transport and handling of the apparatus.

In one embodiment of the invention, the sensor platform has a plurality of further magnets and one or more elements which can slide or roll. These magnets are once again arranged in or on the sensor platform in such a way that they are not in direct contact with the ferromagnetic surface. The physical height of the one or more elements which can slide or roll is greater than that of the magnets, as a result of which they project beyond the magnets from the surface of the sensor platform. They can therefore slide or roll directly on a ferromagnetic surface. This ensures that the sensor always remains in contact with a ferromagnetic surface, in all positions in a gap, while at the same time allowing the sensor platform to slide or roll along the surface with as little resistance as possible.

In a first variant of this embodiment, the magnets are embedded in the sensor platform in that their surfaces are on the same plane as the surface of the platform or their surfaces are slightly covered under the surface of the platform and by a material which can slide on the sensor platform. This ensures correct sliding of the sensor platform on the surface.

In a second variant of this embodiment, the magnets are arranged on the surface of the sensor platform, with a plurality of rolling elements additionally being arranged on the same surface. The rolling elements are in this case designed and arranged such that they project beyond the magnets from the platform surface, and the magnets are correspondingly recessed and therefore cannot come into direct contact with the ferromagnetic surface.

In a further embodiment, the sensor platform has no rolling or sliding elements. However, one or more magnets are embedded in the sensor platform, with their surfaces lying in the same plane as the surface of the platform, or with their surfaces being located slightly under the surface of the platform and being covered by a material which can slide on the sensor platform. This intrinsically ensures that the sensor platform slides on the surface. In one variant, one magnet or a plurality of magnets is or are additionally arranged such that they can move on the sensor platform in a recess, in which case the magnets in the recess can be moved in a direction at right angles to the longitudinal direction of the mount. This allows optimum positioning of the magnets with respect to the ferromagnetic surface, and therefore optimum guidance of the sensor platform along the surface which is intended to be inspected.

In a further embodiment, the apparatus has a mounting or storage roller, by which the mount can be rolled up and unrolled again, and can be moved out. This allows the mount to be stored in the smallest possible space, thus allowing the apparatus to be positioned at locations where the spatial conditions are restricted, and allows simple transport for inspection of a further machine.

In a further embodiment of the invention, the apparatus has one or more pairs of guide elements between which the mount is passed as it moves out and which are used to fix the direction of the mount as it moves out. In a first variant, a pair of guide elements comprises a stationary element and an element which can rotate about its own axis. The stationary element has surfaces which form the convex side of a curvature or tangent to parts of the convex side of a curvature. The element which can rotate comprises a roller with surfaces which form the concave side of a curvature or parts of the concave side of a curvature. The stationary element and the element which can rotate are arranged such that those surfaces of the rotating element which are arranged in a concave form project into the convex surfaces or surface parts of the stationary element.

In a second variant, a pair of guide elements comprises a pair of guide rollers, with each pair of guide rollers comprising a roller with a convex cross section and a roller with a concave cross section of the same curvature. The convex roller is arranged with respect to the concave roller such that the convex-curved part projects into the concave-curved part of the other guide roller.

In both variants, the mount can be passed through between the two guide rollers, with its curvature corresponding to the curvatures of the rollers.

In a further embodiment, along each longitudinal side, the mount has a plurality of openings which are separated from one another by a regular distance. A transport roller, which is driven by the drive, has a plurality of studs which are designed, positioned and separated to correspond to the openings. The mount is guided via this transport roller in that, when the mount is being moved out and rolled in, the studs on the transport roller engage in the openings on the mount. This means that the mount is moved corresponding to the drive force, without sliding, while being moved out and rolled in. The studs and openings also make it possible to determine the length of the mount that has been moved out and the position of the mount within the gap, on the basis of a pulse signal from the drive. At the same time, the transport roller can also be used as a guide element with correspondingly shaped surfaces as described above.

In a further embodiment of the invention, the apparatus has cables in order to transmit measurement signals from the sensor to a signal processing apparatus, wherein the cables are guided along the mount and are attached to it, and can be rolled up together with the mount.

In a further embodiment, the apparatus has electronics on the sensor platform in order to digitize the measurement signals and in order to transmit the signals in accordance with a transmission protocol. This ensures that the signals are transmitted accurately and reliably.

In a further embodiment, the apparatus has a slipring for correct transmission of the measurement signals from the end of the mount at the entrance to the air gap via the storage roller to an apparatus for processing and displaying the measurement signals.

In one embodiment of the invention, the mount comprises an elongated element which is in the form of a strip and is composed of a flexibly elastic metal, for example steel, and an additional elongated element in the form of a strip composed of a plastic which can slide on metal, for example polytetrafluoroethylene (PTFE), also referred to as Teflon™, or a polyethylene. The plastic, which is Teflon™ or polyethylene, is arranged in the form of a strip or a coating on the convex side of the mount, that is to say on the side of the mount which faces the ferromagnetic surface. These materials allow the mount to slide along the ferromagnetic surfaces and the magnetic force to be influenced by the mount material. The Teflon™ or polyethylene is also used for insulation, which is required during a measurement of the magnetic field, and protects both the ferromagnetic surface and the mount against wear. The material of the mount is distinguished on the one hand by its flexibility, which is required for the mount to roll up, and at the same time by its stiffness, which is required for outward movement and guidance in the gap. Furthermore, it has a fatigue resistance which allows it to be unrolled and rolled up again many times without any loss of stiffness.

In order to further increase the stiffness of the mount, the mount in one particular embodiment comprises a plurality of flexibly elastic metal strips, which rest on one another, with this strip composed of plastic, Teflon™ or polyethylene being arranged on the convex surface of the outermost metal strip.

In a further embodiment, the apparatus has an additional drive for its movement over the circumference of a rotor of a generator. The sensor platform may have one or more sensors or one or more measurement instruments, such as a camera for visual inspection or sensors for low-induction iron measurements, or a measurement apparatus for checking the slot sealing in a generator.

In a further embodiment, the sensor platform has a pivotable mirror, for example in conjunction with the camera. This is moved to a suitable position corresponding to the distance between the surface to be inspected and the sensor platform. Furthermore, the pivotable mirror ensures visual inspection of a surface from different viewing angles.

In a further embodiment of the invention, the sensor platform has one or more instruments in order to grip and transport objects in the gap. This makes it possible to simultaneously remove any foreign bodies or undesirable material.

As a result of the arrangement of the mount and the sensor platform, as well as the nature of the controlled movement of the sensor platform in the gap, apparatus according to the invention allows measurements in gaps for example with a height from 4 mm. Furthermore as a result of the small and light weight construction, the apparatus can be transported and handled easily, and can therefore be used in a versatile manner.

BRIEF DESCRIPTION OF THE DRAWINGS

In the figures:

FIG. 8a shows an arrangement of the mount of the inspection apparatus in the air gap of a generator in a cross section at right angles to the generator axis, and FIG. 8b shows a more detailed view of the inspection apparatus in the air gap of a generator as shown in FIG. 8a.

DETAILED DESCRIPTION OF EXEMPLARY EMBODIMENTS

Figure 1:
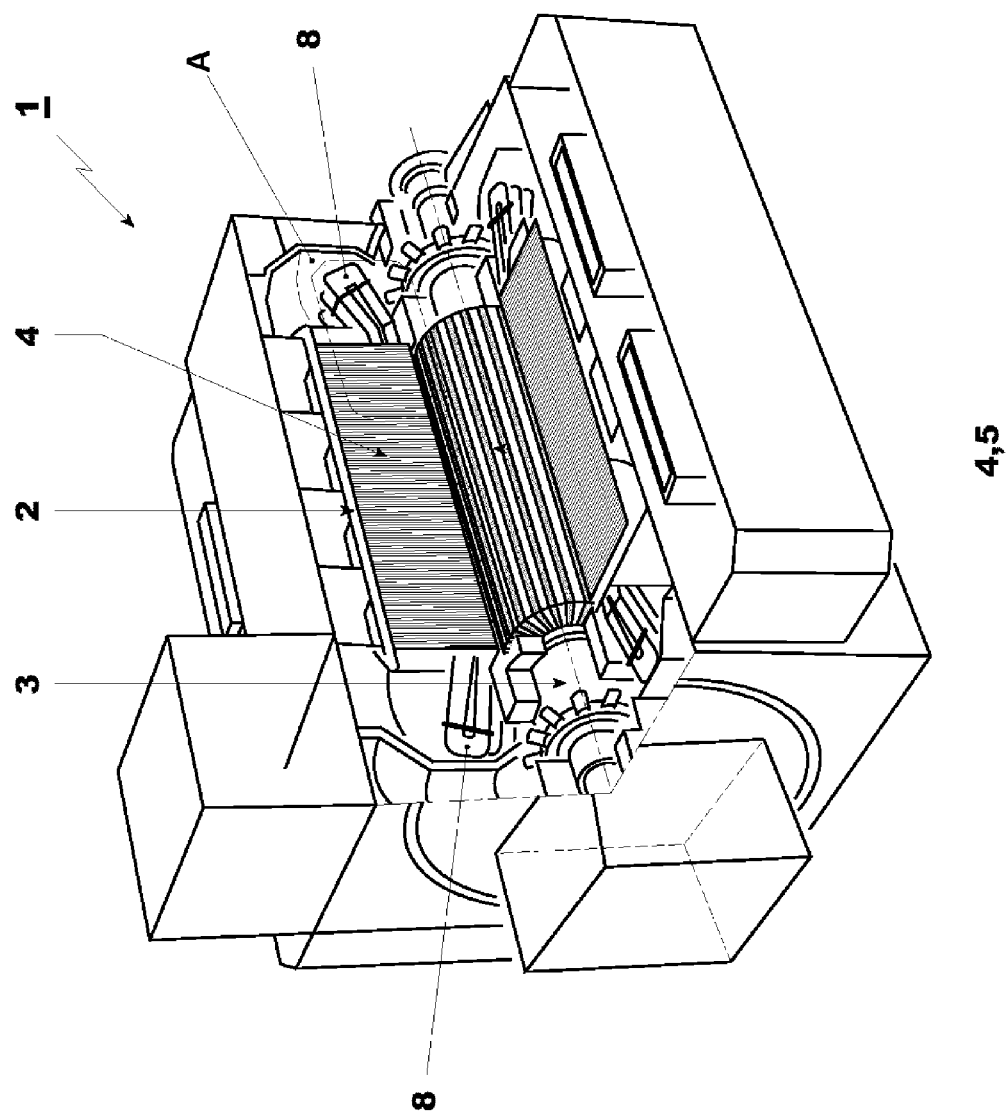
FIG. 1 shows a perspective view of a generator in a power station, in which the apparatus according to the invention can be used.

FIG. 1 shows a general view of a generator 1 in a power station, in particular of its stator 2 and rotor 3, each with ferromagnetic elements 4 (white) and non-ferromagnetic elements 5 (shaded grey).

Figure 2:
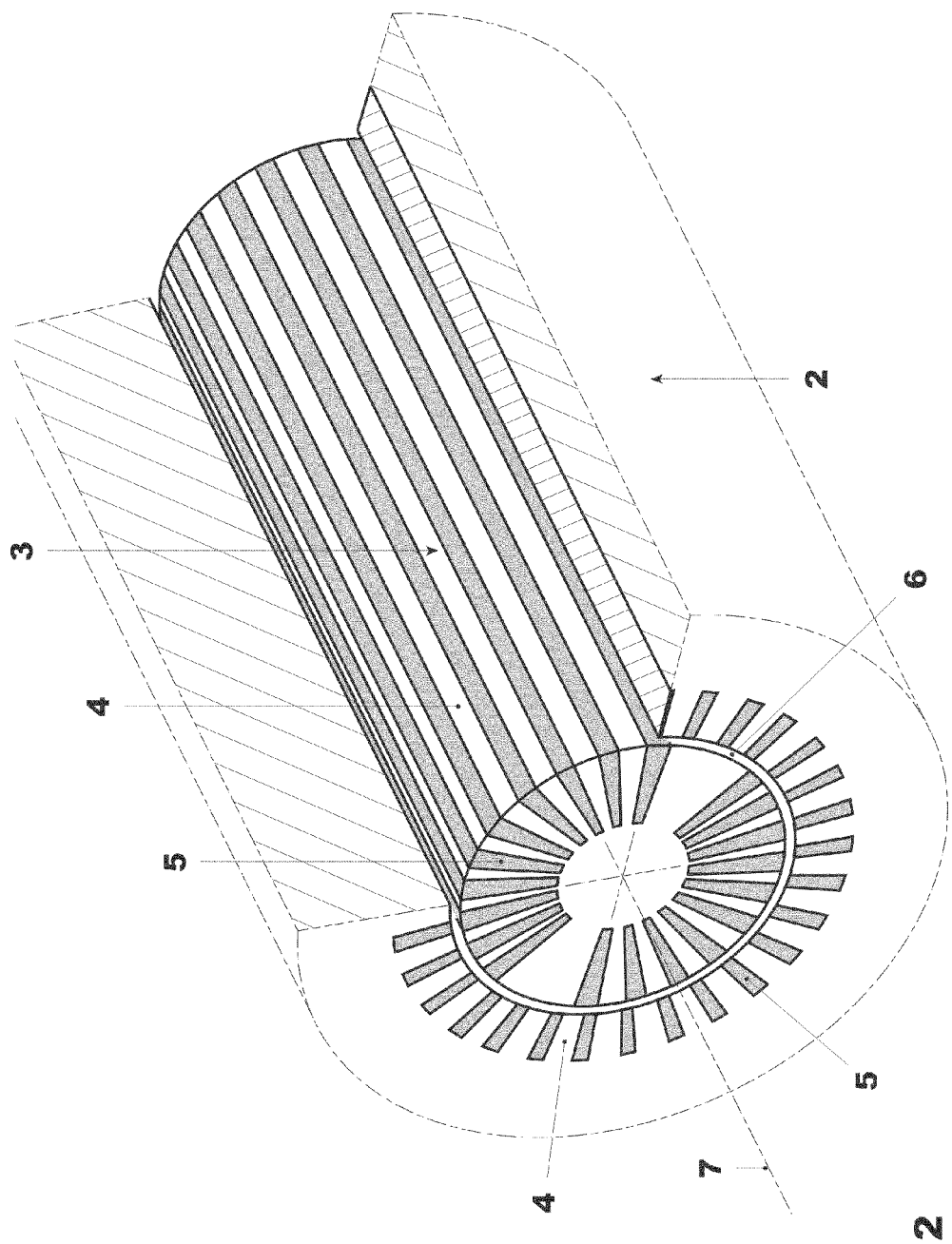
FIG. 2 shows a more detailed perspective view of the stator and rotor of the generator shown in FIG. 1, and of the air gap to be inspected.

FIG. 2 shows a more detailed view of the stator 2 and rotor 3 between which a narrow, annular air gap 6 extends. The surfaces of the stator and rotor each have ferromagnetic elements 4 and non-ferromagnetic elements 5, which are arranged alternately over the circumference and extend parallel to the generator axis 7. The width of the individual elements on the stator is generally constant over its circumference. The width is likewise constant on the rotor, with the exception of the area of the magnetic poles. On the rotor, the ferromagnetic material is the rotor material itself. A plurality of slots extend parallel to the rotor axis, in which slots the winding is arranged and is secured in the slots by wedges. These wedges and the winding form the non-ferromagnetic elements. The winding is composed of copper. The wedges may be composed of various non-ferromagnetic materials. In a similar manner to that in the case of the rotor, the ferromagnetic material on the stator is the stator material itself, with the non-ferromagnetic material being the material of the stator winding and securing wedges, which extend parallel to one another in slots and parallel to the axis of the generator.

Figure 3:
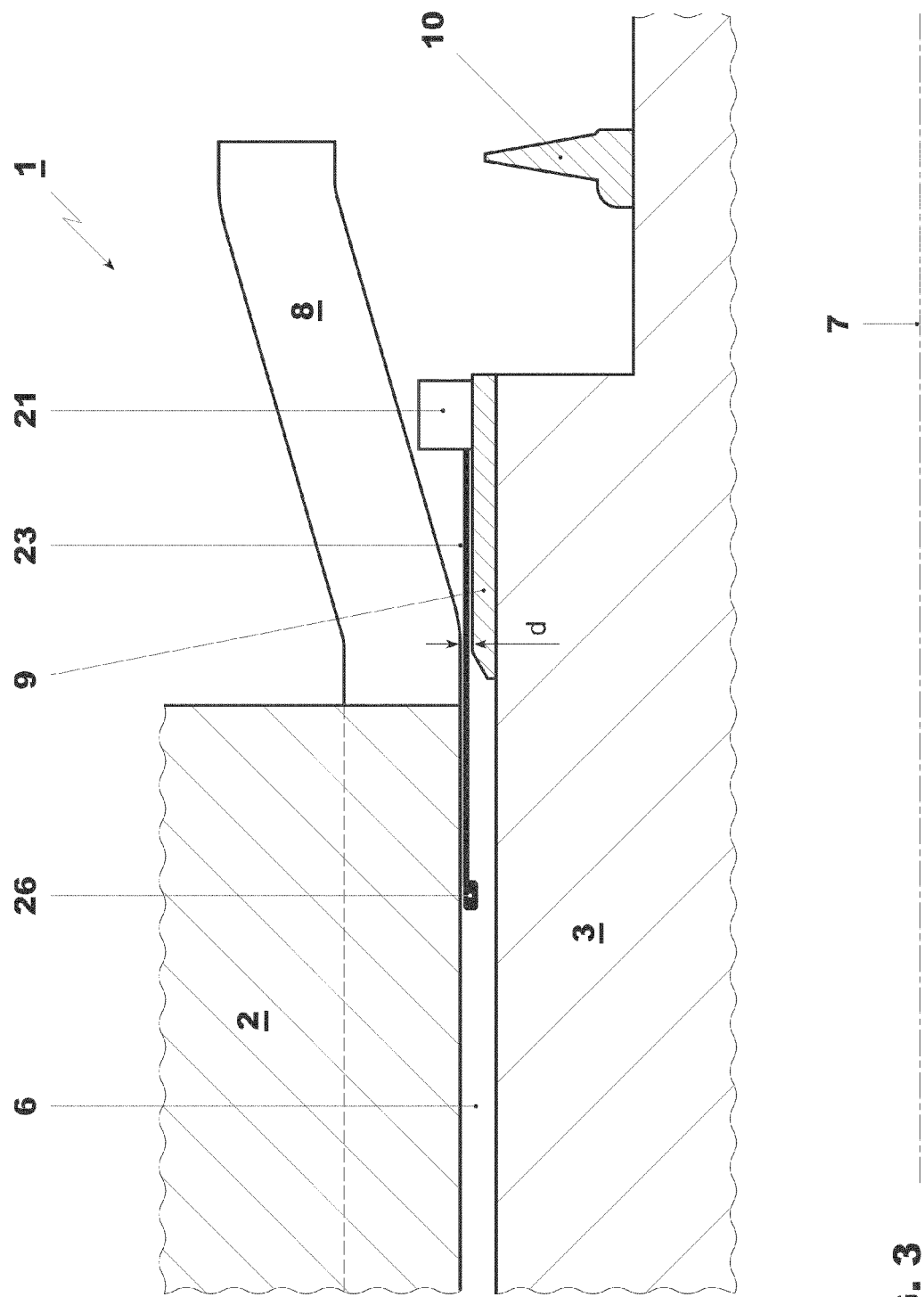
FIG. 3 shows a view in a cross section along the rotor axis of a part of the stator and rotor annotated A in FIG. 1, with an entrance geometry to the air gap.

FIG. 3 shows a typical entrance element to an air gap 6 between the stator 2 and the rotor 3 of a generator 1. The apparatus for inspection according to the invention can be placed in this entrance element and the mount with the sensor platform can be inserted into the gap.

A rotor cap 9 is located on the rotor 3 at the entrance to the gap on the rotor 3 and extends parallel to the generator axis and radially toward the stator bar 8. The stator bar 8 and the rotor cap 9 define the width d of the gap 6 through which the mount 23 with the sensor platform 26 of the apparatus is intended to be passed. This width d may, for example, be only 4 mm. The mount 23 of the sensor platform 26 can then pass through a gap of this width when designed according to the invention.

A fan 10 is arranged outside the rotor cap 9. This further restricts the spatial conditions for an inspection apparatus. A housing 21 can be placed there, thanks to the sensor mount being stored rolled up. Furthermore, by virtue of its compact size, the apparatus can be matched to different entrance geometries of different generators. In one variant of the invention, a guide rail can additionally be arranged between the position of the housing 21 and the entrance opening to the gap 6, and can guide the mount to the start of the ferromagnetic surfaces.

Figure 4:
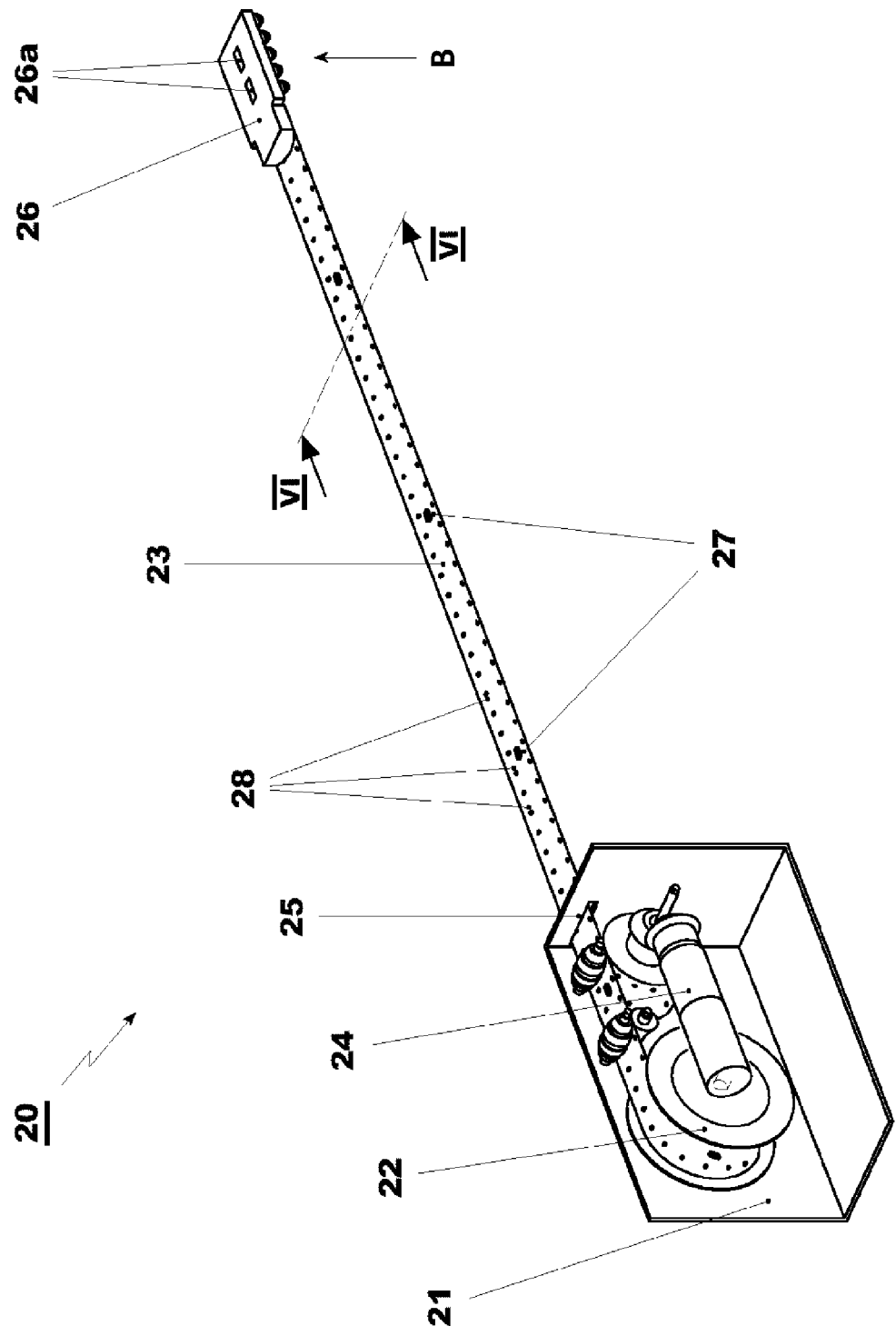
FIG. 4 shows an overall view of the inspection apparatus according to the invention.
Figures 5, 6:
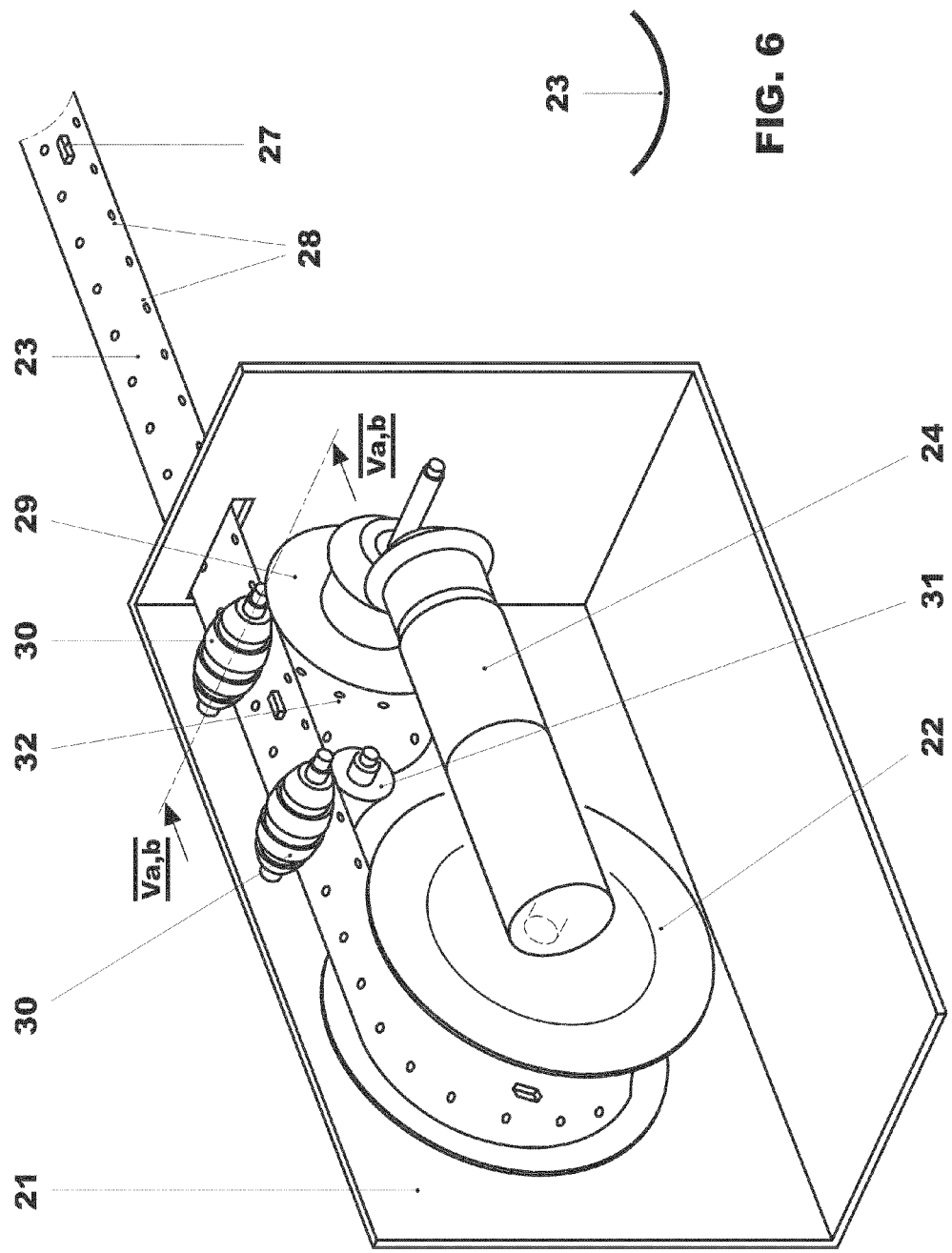
FIG. 5 shows a partial view of the inspection apparatus according to the invention, in particular a more detailed view of the apparatus for rolling up and unrolling a mount for the sensor platform.
FIG. 6 shows a cross-sectional view of the mount along VI-VI in FIG. 4 at right angles to the longitudinal extent of the mount.

FIG. 4 illustrates an exemplary inspection apparatus according to the invention as an entity; FIG. 5 shows a view of an apparatus for rolling up and unrolling as well as guidance of the mount. This includes a housing 21 for a storage roller 22 for storing a mount 23 as well as various elements for rolling up and unrolling and for moving the mount out of the housing 21. A sensor platform 26 with sensors for the inspection of the surfaces, for a low-induction iron measurement, and for testing the slot sealing, etc., is arranged at the end of the mount. The mount is unrolled from the storage roller 22 by a drive 24 which drives the storage roller 22 and the transport roller 29. By way of example, the drive 24 has a return spring.

Over its circumference, the transport roller 29 has two rows of transport studs 32 which are separated at regular distances and engage in transport openings 28 in the mount 23. For this purpose, the transport openings are likewise arranged in two parallel-running longitudinal rows on the mount, with the separation, shape and dimension being matched to those of the transport studs thus ensuring that the mount is transported correctly, without sliding. An opening 25 through which the mount is moved out of the housing 21 is located in the housing 21.

Furthermore, a plurality of magnets 27 are attached to the mount 23 along its length, and are distributed over the length of the mount. These allow the mount and the sensor platform to be positioned along the ferromagnetic surfaces without the mount becoming detached therefrom as a result of the force of gravity. The magnets are attached to the concave surface of the mount, with this concave surface facing away from the ferromagnetic surface. This makes it possible to move the mount such that it slides along the ferromagnetic surface, but remains in contact with it, and maintains its position relative to the ferromagnetic surface, in this context see also FIGS. 8a and b.

The magnets 27 are designed to be as small as possible, in particular with a physical height which is as small as possible, in order to allow the mount to be stored in as small an area as possible when in the rolled-up state. On the one hand, the magnets can be secured directly on the mount surface by a suitable adhesive. Alternatively, the magnets can be arranged in depressions in the mount and can be secured by adhesive. In order to increase the security further, a fabric whose shape can easily be adapted can be placed above the magnets and can be secured by adhesive.

The mount is preferably composed of a flexibly elastic material, for example steel, which is suitable for rolling up and rolling out. Preferably and in particular in order to increase the stiffness in the rolled-out state, the mount is subject to a rolling-in stress and a lateral bending stress in the rolled-up state, with the lateral bending stress being greater than the rolling-in stress. This contributes to the mount having a curved cross section in the rolled-out state, and therefore being stiff in this state.

Figure 5A:
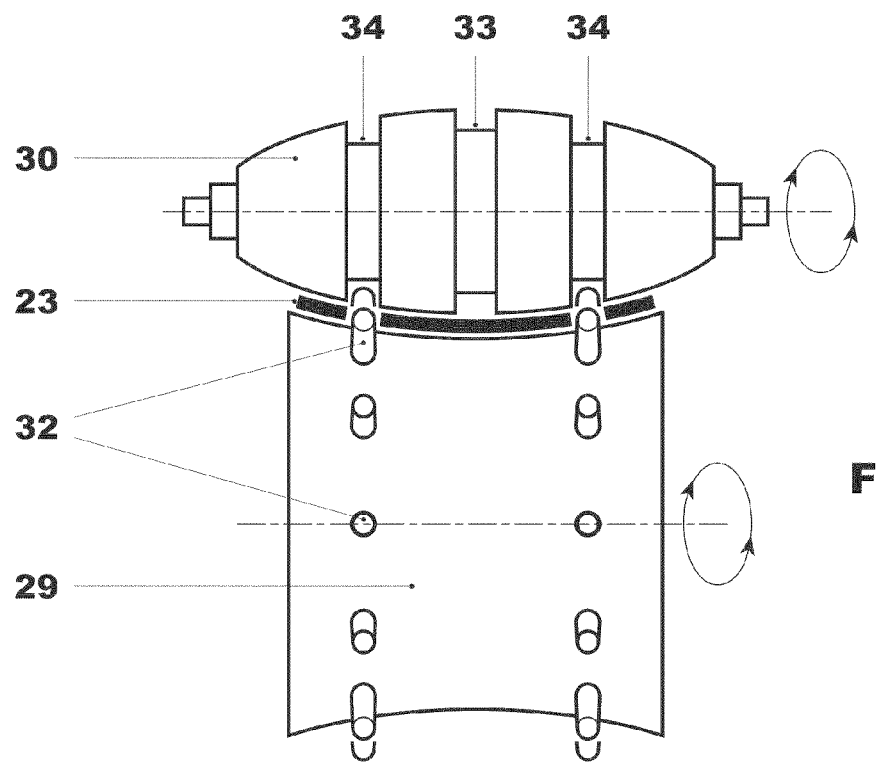
FIG. 5a shows a first variant of elements for guidance of the mount at a view taken at line Va,b-Va,b.

In order to define the direction in which the mount 23 moves out, the apparatus has a pair of guide rollers 30, 31 via which the mount 23 is guided. The pair of guide rollers each includes a roller 30 with a convex cross-sectional shape and a roller 31 with a concave cross-sectional shape and with the same curvature, with these being arranged with respect to one another, as shown in FIG. 5a) such that the curvature of the convex roller projects into that of the concave roller, and guides the mount 23 through between the two. The guide rollers 30 and 31 are in this case used to define the direction of the mount 23, with the mount 23 retaining the curvature as shown in FIG. 6. The convex and concave surfaces of the rollers 30 and 31 are in this case positioned with respect to one another such that the mount 23 retains its longitudinal direction, in which it is moved out, and is not bent or kinked. The convex rollers 30 have a slot 33 approximately in their center and over their circumference, through which the magnets 27 can pass. Two further slots 34 are arranged on the convex roller 30, over its circumference and in each case at the same height as the transport studs 32 and transport openings 25. These allow the transport studs 32 to pass correctly.

Figure 5B:
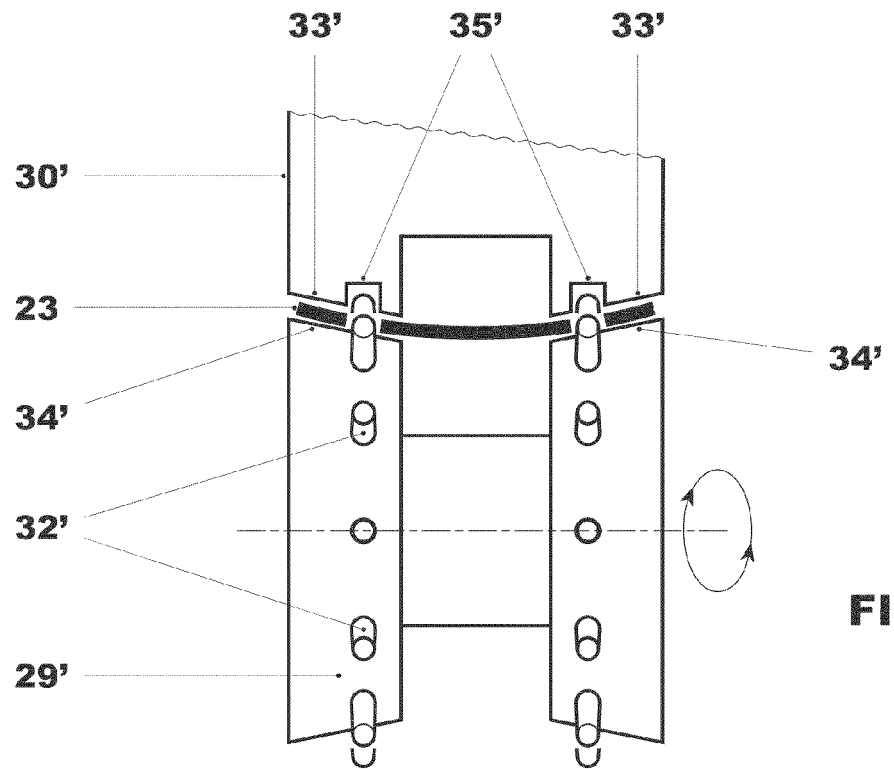
FIG. 5b shows a second variant of elements for guidance of the mount at a view taken at line Va,b-Va,b.

In one variant of the invention, the mount can also be guided by elements as shown in FIG. 5b). There, a pair of guide elements includes an element 30', which is attached in a fixed manner, and a roller 29' which can rotate about an axis. The mount 23 is passed through between the two elements, with the rollers defining the direction in which the mount moves out. Both elements have surfaces which are either curved in a corresponding manner to the curvature of the mount or form a tangent to the curved surface of the mount. Once again, the element 30' has a slot 35' in each of its surfaces 33', which slots allow the studs 32' to pass.

A sensor platform 26 is attached to the end of the mount 23, on which sensor platform 26 one or more sensors and measurement apparatuses can be arranged, such as a camera, eddy-current sensor, sensor for low-induction iron measurement, etc. Furthermore, electronics can also be arranged there, for example for amplification, digitizing and compression of measurement signals and image signals.

Measurement signals from the sensors are first of all amplified, digitized, if necessary compressed, and finally transmitted in accordance with the transmission protocol, by electronics on the sensor platform. This ensures the necessary accuracy of the transmission of the typically small signals.

For this purpose, cables (not illustrated) are mounted along the mount 23. These cables are rolled up with the mount on the storage roller 22 when the mount is stored. In order to allow the transmission of the signals from the end of the mount on the rotating storage roller 22 to a signal processing apparatus, the apparatus has a slipring on the storage roller. The position of the sensor platform in the gap can be determined by using pulsed signals from the drive 24 for the storage roller 22 and transport roller 29, with their position accuracy being dependent on the mount not sliding while being moved in and out, that is to say being dependent on the accuracy of the transport studs and transport openings.

Figure 7A:
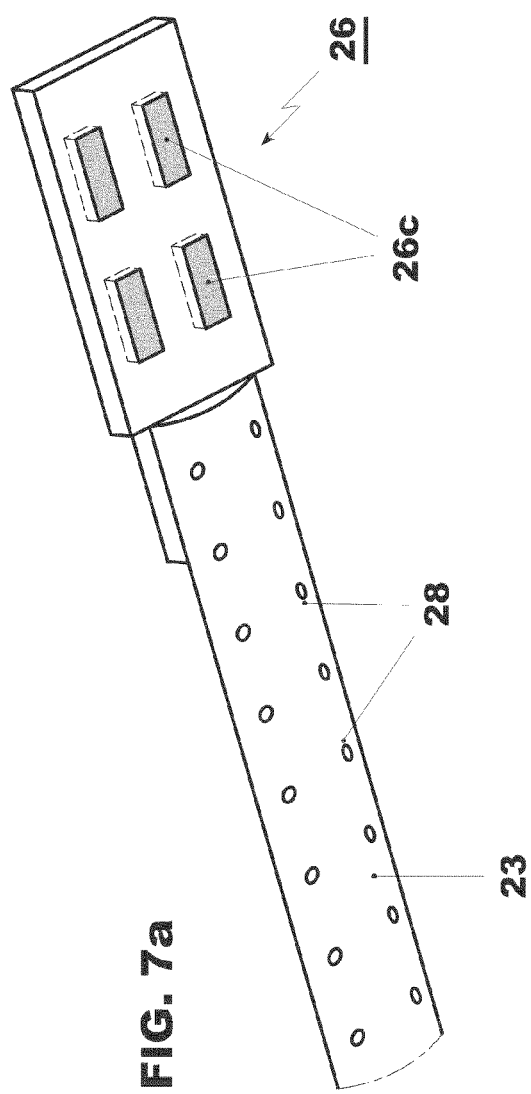
FIG. 7a shows a partial view taken at direction B in FIG. 4 of a first variant of a sensor platform of the inspection apparatus.

FIG. 7a shows the sensor platform 26 from the view indicated by the arrow VIIa in FIG. 4, and in particular the side of the sensor platform which comes into contact with a ferromagnetic surface. In this first variant, the sensor platform 26 is fitted with a number of magnets 26c which are embedded in the material of the sensor platform 26, and are covered by the platform material. In this case, the magnet strength and distance between the magnets and the platform surface are chosen so as once again to ensure that the platform always remains in contact with the ferromagnetic surface. Since the magnets do not project from the surface of the platform, this allows sliding along the ferromagnetic surfaces. Alternatively, the magnets 26c can also be embedded just so far in the platform material that their surface lies on the same plane as the sensor platform.

Figure 7B:
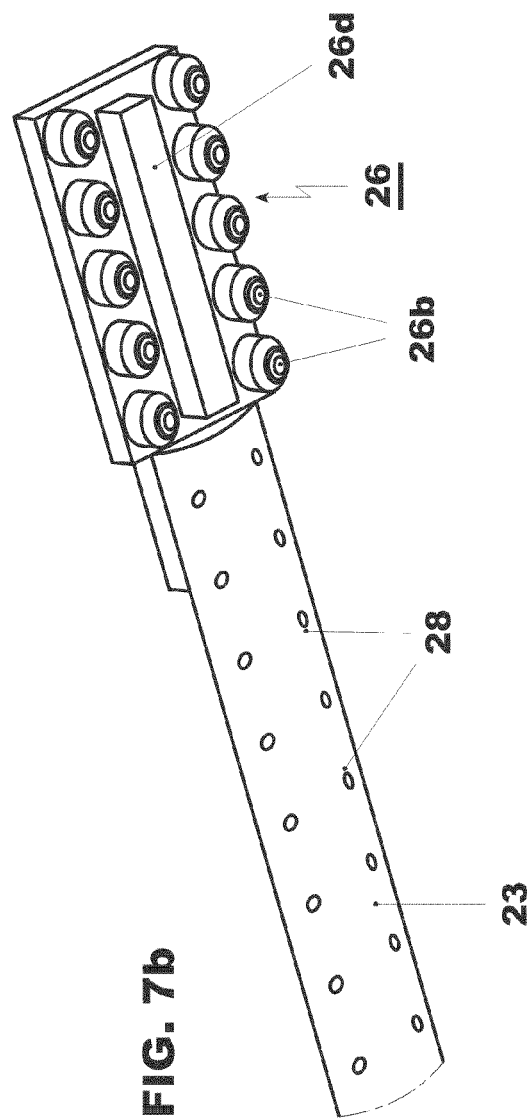
FIG. 7b shows a partial view taken at direction B in FIG. 4 of a second variant of a sensor platform of the inspection apparatus, FIG. 7c uses the same perspective as that in FIG. 4 to show a view of the sensor platform with movable magnets and a pivotable mirror.
Figure 7C:
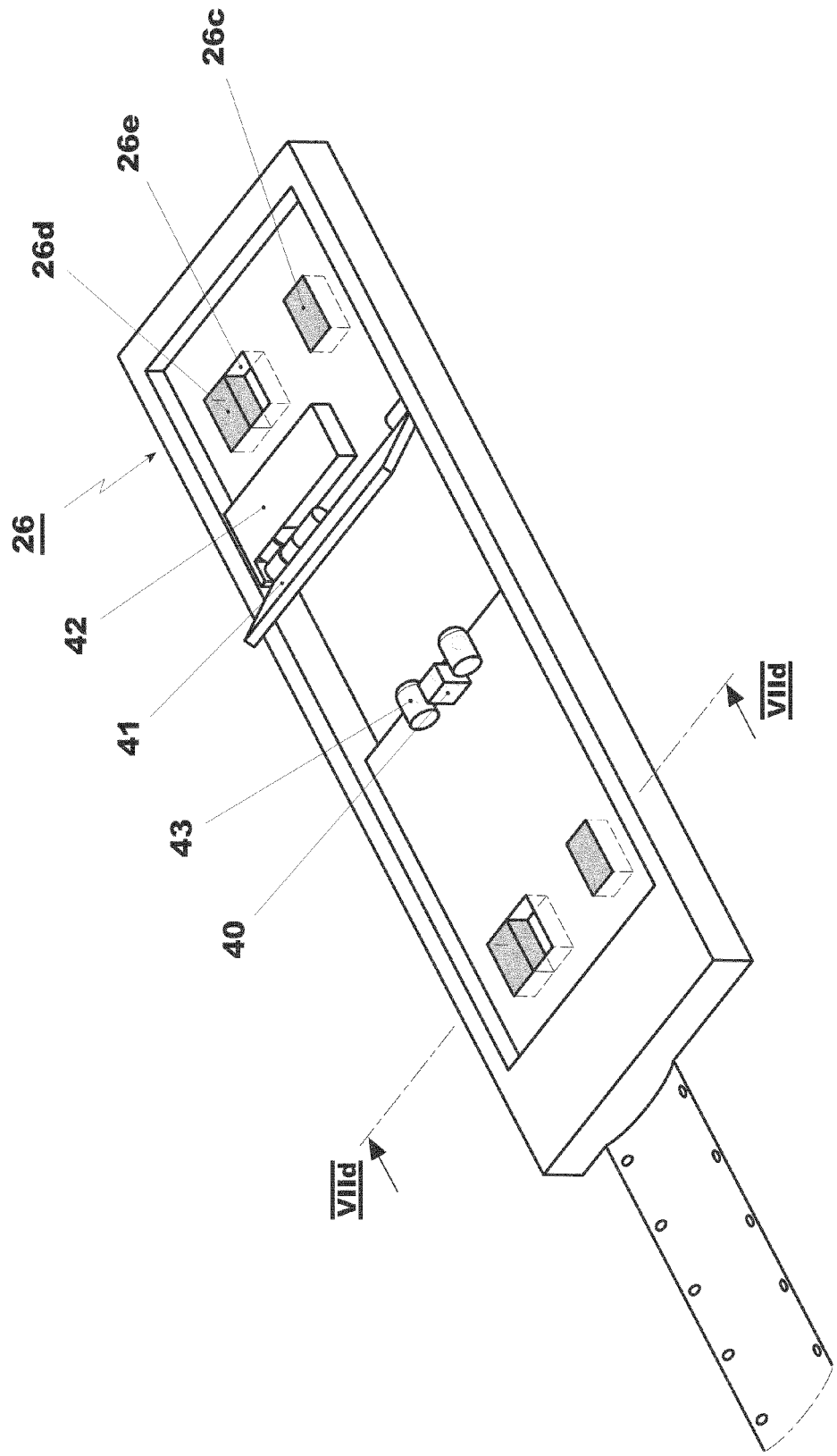
FIG. 7d shows the position of the sensor platform from FIG. 7c on a ferromagnetic surface in the air gap of a generator, in a cross sectional view taken at right angles to the generator axis at line VIId-VIId in FIG. 7c.
FIG. 7e shows a further embodiment of the inspection apparatus with a guide rail for the mount in order to stabilize the mount outside the stator of a generator.
Figure 7D:
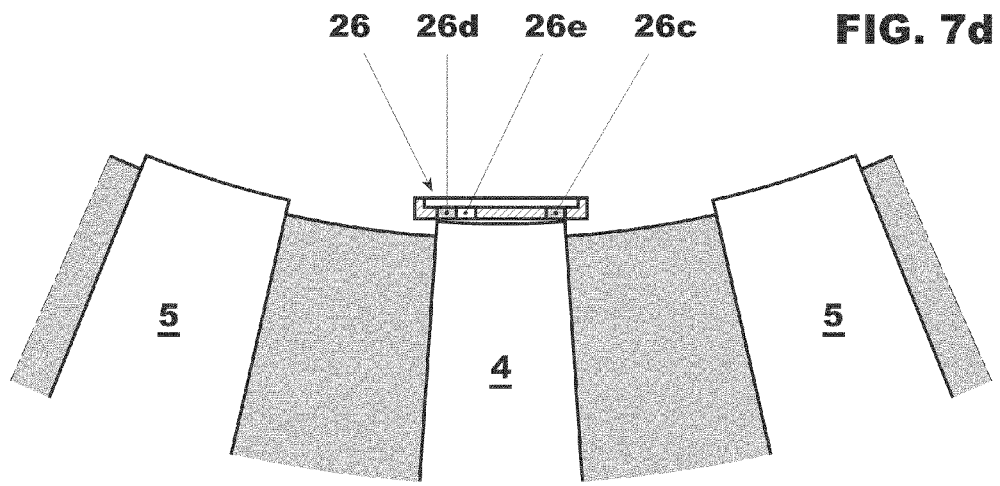

FIG. 7c shows a sensor platform in the same perspective as in FIG. 4, with magnets 26c and 26d being embedded in the sensor platform 26 such that they do not come into direct contact with the ferromagnetic surface. In the illustrated example, first magnets 26c are arranged in a fixed position. In contrast, second magnets 26d are arranged in a recess 26e, with the recess allowing manual movement of the magnets 26d in a direction at right angles to the longitudinal direction of the sensor platform 26 and of the mount 23, and in the plane of the sensor platform. When the inspection apparatus is used in the air gap of generators, the recess 26e allows the positioning of the magnets corresponding to the width of the ferromagnetic surfaces 4, as is shown in FIG. 7d. There, the outer edges of the magnets 26d and the magnets 26c are positioned such that they are aligned with the outer edges of the ferro-magnetic surface 4.

FIG. 7c additionally shows the arrangement of a camera 40 and of light sources 43 for visual inspection of the surfaces. The mirror 41 can be pivoted by a drive 42, for example by remote control during the inspection, and can thus be moved to an optimum position. This allows inspection of a surface corresponding to the focal length of the camera, and at different angles, as well as the inspection of different surfaces in an air gap, for example the surfaces of the stator and those of the rotor as well.

In the same view as in FIG. 7a, FIG. 7b shows a second variant of the sensor platform 26. In this case, the sensor platform 26 has one or more magnets 26d and a plurality of rolling elements 26b which ensure movement along the ferromagnetic surface. The magnets 26d are in this case not in direct contact with the ferromagnetic surface, but, because of their thickness and distance from the ferromagnetic surface, ensure that the sensor platform 26 remains in contact with the ferromagnetic surface in all their usage positions, for example in a generator.

Figure 7E:
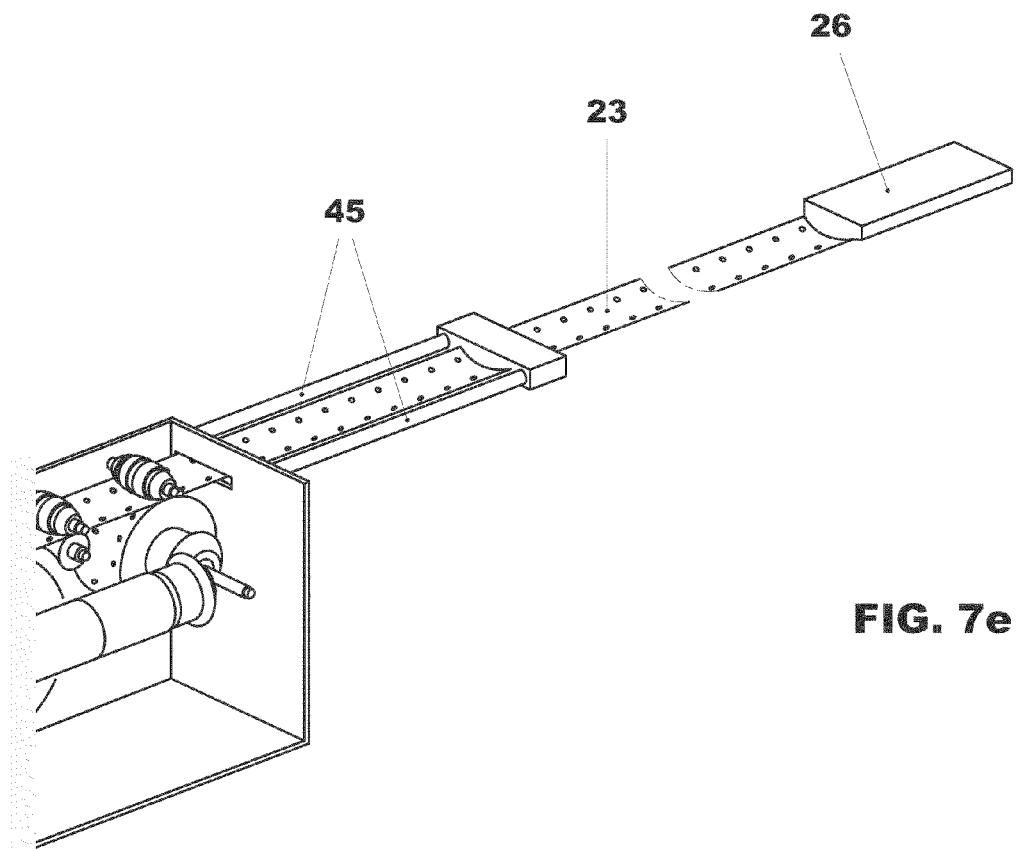

A further embodiment of the inspection apparatus as shown in FIG. 7e has a guide rail 45 which stabilizes the mount 23 over a first distance as of the opening 25 in the housing 21. This embodiment has advantages for example when using the apparatus for inspection of the air gap of a generator. Since the apparatus can be moved only as far as a specific distance from the entrance to the air gap and thus from the ferromagnetic surfaces, the mount must be extended over this distance without the aid of the magnets. In order to prevent bending of the mount in this area in front of the air gap of the generator, the guide rail stabilizes the mount over this area.

FIGS. 8a and b show the position of the mount 23 with the sensor platform 26 in a gap 6 between a stator 2 and a rotor 3 of a generator. The curved mount 23 is shown in the form of a cross section with a magnet 27 in contact with a ferromagnetic surface 4 of the stator.

For the particular application of an apparatus for inspection of an air gap in a generator, the type of mounting of such an apparatus is generally known. A belt which can be tightened is typically used for this purpose, in order to mount the apparatus on the rotor, with the apparatus being arranged, for example, on rollers or sliding elements which are moved over the circumference of the rotor.

In a further embodiment of the apparatus according to the invention, the apparatus has a drive in order to move it in the circumferential direction on the rotor. In particular, the radial position (relative to the rotor surface) of the housing 21 for the roller 22 to support the mount together with the mount and its guide rail is adjustable relative to the position of the drive for movement of the apparatus. This allows, for every generator to be inspected, an optimum radial positioning, corresponding to the generator type.

List of Reference Symbols
1 Generator
2 Stator
3 Rotor
4 Ferromagnetic elements
5 Non-ferromagnetic elements
6 Air gap
7 Generator/rotor axis
8 Stator bar
9 Rotor cap
10 Fan
20 Inspection apparatus
21 Housing
22 Roller for storing the mount
23 Mount
24 Drive
25 Opening
26 Sensor platform
26a Sensors
26b Rolling element
26c Magnet
26d Movable magnet
26e Recess for movable magnet
27 Magnet
28 Transport openings
29 Guide and transport roller
30 Guide roller (convex)
31 Guide roller (concave)
32 Transport stud
33 Slot in the convex roller
34 Slots in the convex roller
33' Obliquely running surfaces in the element 30'
34' Obliquely running surfaces in the element 30'
35' Slots in the element 30'
d Gap width between the rotor cap 9 and the stator bar 8
40 Camera
41 Pivotable mirror
42 Drive for pivotable mirror
43 Light sources
45 Guide rail While the invention has been described in detail with reference to exemplary embodiments thereof, it will be apparent to one skilled in the art that various changes can be made, and equivalents employed, without departing from the scope of the invention. The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

We claim:

1. An apparatus for inspection of a gap between two surfaces, at least one surface of which is ferromagnetic, comprising:

a sensor platform with at least one sensor;

an elongated, movable, and rollable mount, the sensor platform being attached to the mount, wherein the mount is movable into and out of the gap through an access opening and over the length of the gap;

a plurality of magnets arranged on the mount, which magnets are distributed over the length of the mount and bring the mount into contact with said ferromagnetic surface when the mount is inserted into the gap, and wherein the magnets are attached to a surface of the mount facing away from the ferromagnetic surface; and a roller, wherein the mount is supported by and at least partially rolled up on the roller.

2. The apparatus for inspection of a gap as claimed in claim 1, wherein the mount has a curved lateral cross-sectional shape.

3. The apparatus for inspection of a gap as claimed in claim 1, wherein the sensor platform comprises at least one magnet and at least one rolling or sliding element, and wherein the height of the at least one rolling or sliding element is greater than the height of the at least one magnet.

4. The apparatus for inspection of a gap as claimed in claim 1, further comprising:

a mounting or storage roller with a flat rolling surface onto which the mount can be rolled with a flat cross section and from which the mount can be rolled off; and at least one pair of guide elements, wherein each pair of guide elements comprises an element with convex surfaces and an element with concave surfaces with the same curvature as said convex surfaces, and wherein the convex element is positioned relative to the concave element such that a convex-curved part of the convex element projects into a concave-curved part of the concave element, and the mount can be moved between the two guide elements.

5. The apparatus for inspection of a gap as claimed in claim 1, wherein the mount includes longitudinal sides, wherein the mount comprises a plurality of openings along said longitudinal sides which are separated from one another by a regular distance, and further comprising:

a transport roller with a plurality of studs configured and arranged to engage the openings on the mount.

6. The apparatus for inspection of a gap as claimed in claim 1, further comprising:

cables arranged along the mount configured and arranged to transmit measurement signals from the one or more sensors on the sensor platform to an opposite end of the mount.

7. The apparatus for inspection of a gap as claimed in claim 1, wherein the sensor platform comprises electronics configured and arranged to digitize the measurement signals and to transmit the measurement signals in accordance with a transmission protocol.

8. The apparatus for inspection of a gap as claimed in claim 7, further comprising:

a storage roller for the mount to roll on; and a slipring on said storage roller configured and arranged to transmit the measurement signals from said opposite end of the mount to a signal processing apparatus.

9. The apparatus for inspection of a gap as claimed in claim 1, wherein the mount comprises at least one elongated strip formed of a flexibly elastic metal which, in a rolled-out state, has a curvature with a convex side and a concave side in lateral cross section.

10. The apparatus for inspection of a gap as claimed in claim 9, wherein, in the rolled-out state, the mount is subject to a rolling-in stress and is subject to a lateral bending stress, wherein the lateral bending stress is greater than the rolling-in stress.

11. The apparatus for inspection of a gap as claimed in claim 1, wherein, on the convex side, the mount has a strip or polymer coating which can slide on metal.

12. The apparatus for inspection of a gap as claimed in claim 11, wherein said polymer comprises polytetrafluoroethylene or polyethylene.

13. The apparatus for inspection of gap as claimed in claim 1, further comprising:

a motor configured and arranged to roll up the mount outside of the gap.

14. The apparatus for inspection of a gap as claimed in claim 13, further comprising:

a second drive configured and arranged to move the apparatus over the circumference of a rotor of a generator, the second drive being radially movable.

15. The apparatus for inspection of a gap as claimed in claim 1, wherein the sensor platform comprises at least one sensor configured and arranged for visual inspection or low-induction iron measurements.

16. The apparatus for inspection of a gap as claimed in claim 8, wherein the storage roller comprises a return spring.

17. The apparatus for inspection of a gap as claimed in claim 1, wherein the mount comprises depressions, and wherein the magnets are each attached in a depression with adhesive.

18. The apparatus for inspection of a gap as claimed in claim 1, wherein the sensor platform comprises at least one instrument configured and arranged to grip and transport objects in the gap.

19. The apparatus for inspection of a gap as claimed in claim 1, wherein the sensor platform comprises at least one magnet embedded in the sensor platform and a material which can slide covering the at least one magnet, or a surface of said at least one magnet lies in a plane of a surface of the sensor platform.

20. The apparatus for inspection of a gap as claimed in claim 19, wherein the sensor platform comprises at least one movable magnet and a recess, wherein the at least one movable magnet is in said recess such that the at least one magnet is movable in a direction perpendicular to the longitudinal direction of the mount.

21. The apparatus for inspection of a gap as claimed in claim 1, wherein the sensor platform comprises a pivotable minor.

22. The apparatus for inspection of a gap as claimed in claim 1, further comprising:

a guide rail configured and arranged to stabilize the mount.

23. The apparatus for inspection of a gap as claimed in claim 1, wherein the mount is configured and arranged to be rolled out into an open configuration and is stiff when in said open configuration.

* * * * *